United States Patent
Shim

[11] Patent Number: 5,822,770
[45] Date of Patent: Oct. 13, 1998

[54] MEMORY INTERFACING METHOD AND CIRCUIT OF VARIABLE LENGTH DECODER FOR ACCESSING EXTERNAL MEMORY WHEN EMPTY PORTION OF INTERNAL MEMORY EXCEEDS A PREDETERMINED LEVEL

[75] Inventor: Dae-yun Shim, Seoul, Rep. of Korea

[73] Assignee: Samsung Electronics Co., Ltd., Kyungki-Do, Rep. of Korea

[21] Appl. No.: 581,254

[22] Filed: Dec. 29, 1995

[30] Foreign Application Priority Data

Oct. 14, 1995 [KR] Rep. of Korea ............. 1995-35448

[51] Int. Cl.[6] .................................. G06F 13/00
[52] U.S. Cl. ..................... 711/154; 341/67; 382/246; 395/309
[58] Field of Search .................. 348/407, 419; 382/232, 246; 341/67; 395/410, 420, 421.02, 386, 309; 364/725.03, 725.01; 371/37.05; 711/154

[56] References Cited

U.S. PATENT DOCUMENTS

| | | | |
|---|---|---|---|
| 4,985,766 | 1/1991 | Morrison et al. | 348/419 |
| 5,220,325 | 6/1993 | Ackland et al. | 341/67 |
| 5,231,485 | 7/1993 | Israelsen et al. | 348/405 |
| 5,386,212 | 1/1995 | Shen et al. | 341/67 |
| 5,424,733 | 6/1995 | Fimoff et al. | 341/67 |
| 5,440,753 | 8/1995 | Hou et al. | 711/108 |
| 5,459,413 | 10/1995 | Kim | 326/86 |
| 5,479,527 | 12/1995 | Chen | 382/232 |
| 5,502,493 | 3/1996 | Meyer | 348/845 |
| 5,576,765 | 11/1996 | Cheney et al. | 348/407 |
| 5,579,052 | 11/1996 | Artieri | 348/416 |
| 5,606,370 | 2/1997 | Moon | 348/390 |
| 5,621,432 | 4/1997 | Hannah | 345/133 |
| 5,666,115 | 9/1997 | Colavin | 341/67 |

*Primary Examiner*—Eddie P. Chan
*Assistant Examiner*—Hong C. Kim
*Attorney, Agent, or Firm*—Sughrue, Mion, Zinn, Macpeak & Seas, PLLC

[57] ABSTRACT

A memory interfacing method for a variable-length decoder and a circuit therefor are provided. The memory interfacing circuit includes a read controller for generating a read chip-enable signal and a read address in response to a first request signal output from the variable-length decoder, generating a second request signal when the read address reaches a predetermined level, and providing the second request signal to an external memory controller which is connected to an external memory, a write controller for generating a write address and a write section signal in response to an accept signal generated by the external memory controller in response to the second request signal, and an internal memory controller which includes an internal memory, for controlling data provided from an external memory to be written according to the write address and the write section signal generated by the write controller. Accordingly, the present invention simplifies complex signal processing due to frequent memory access between a variable-length decoder and an external memory.

16 Claims, 5 Drawing Sheets

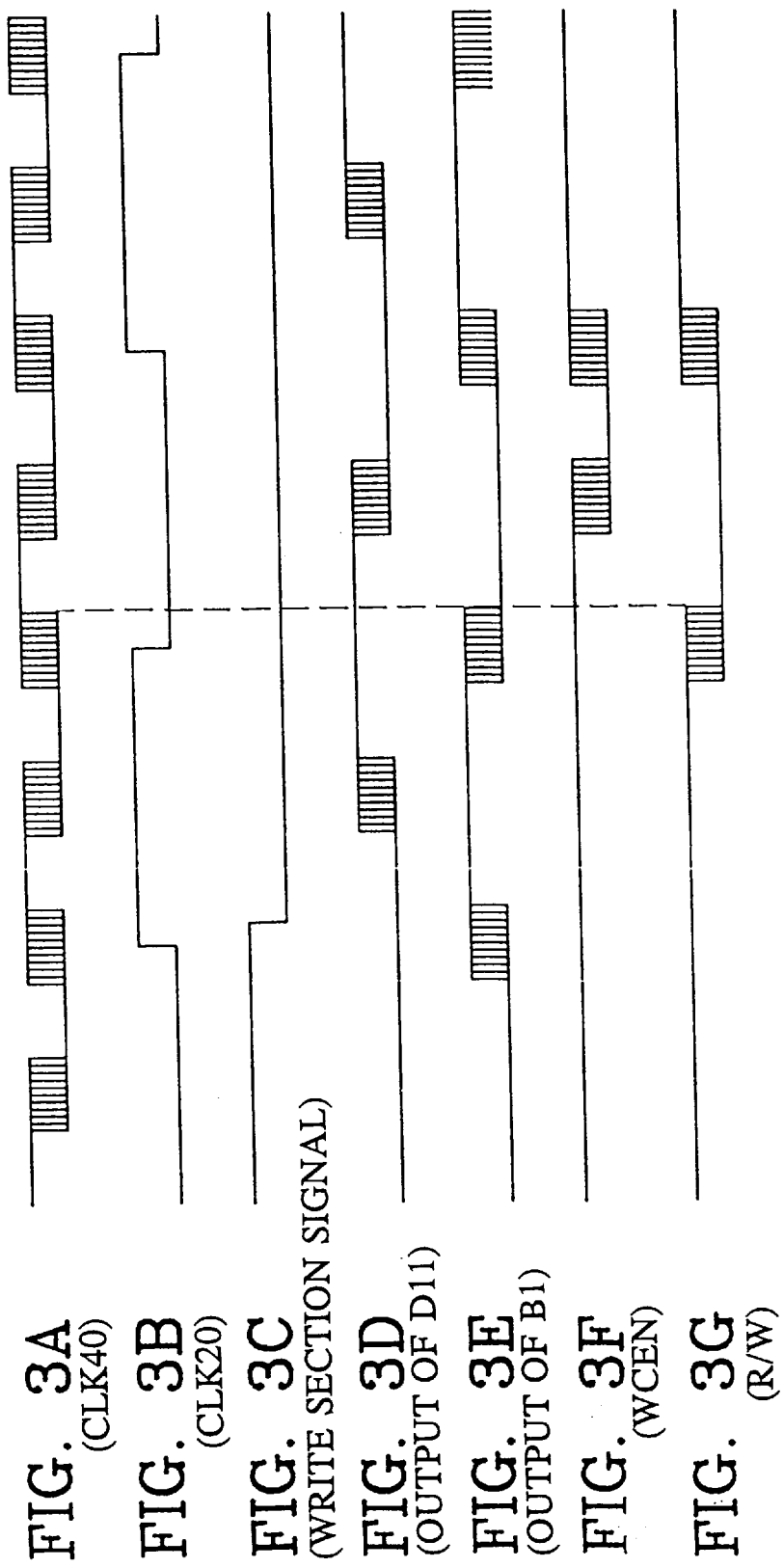

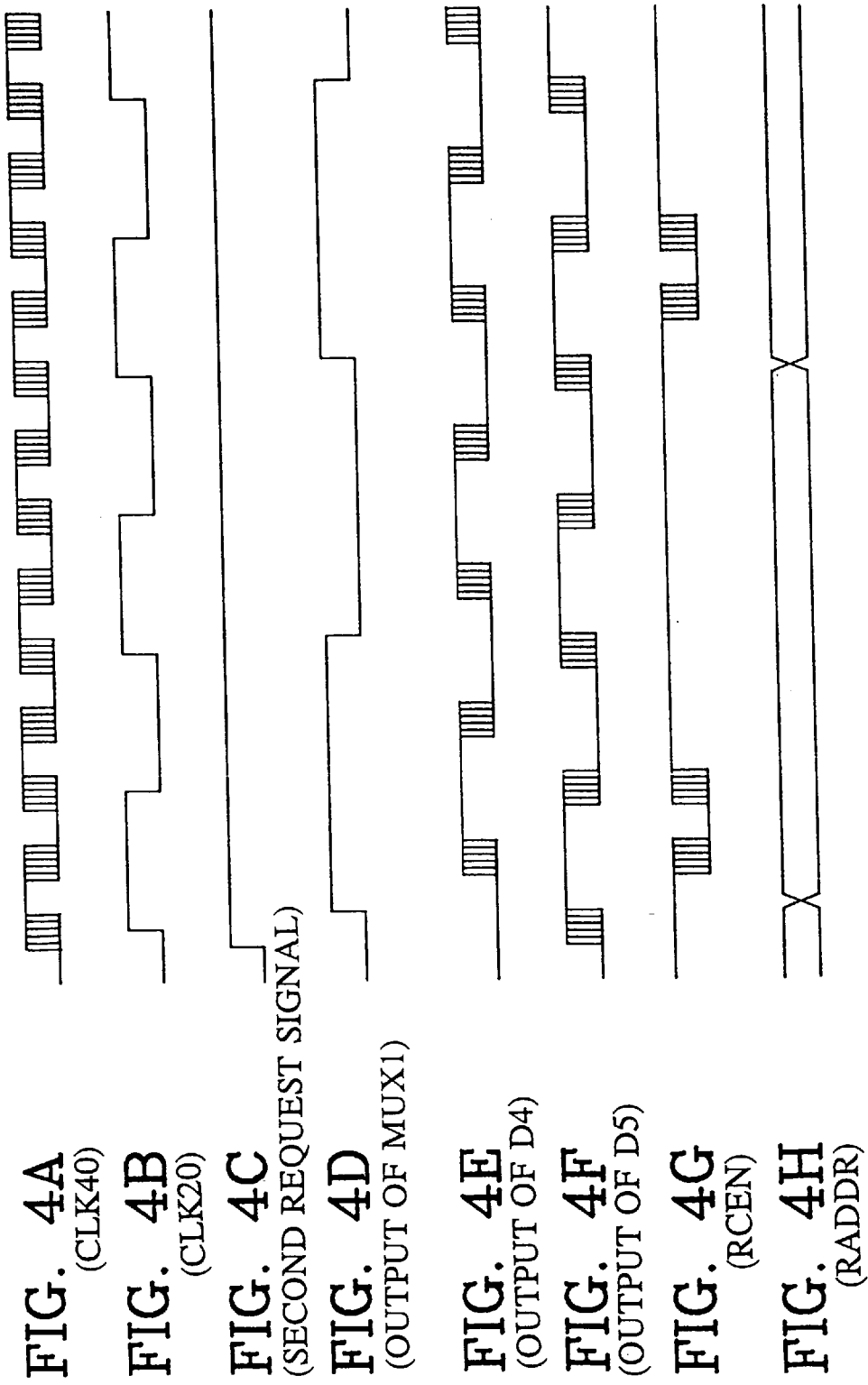

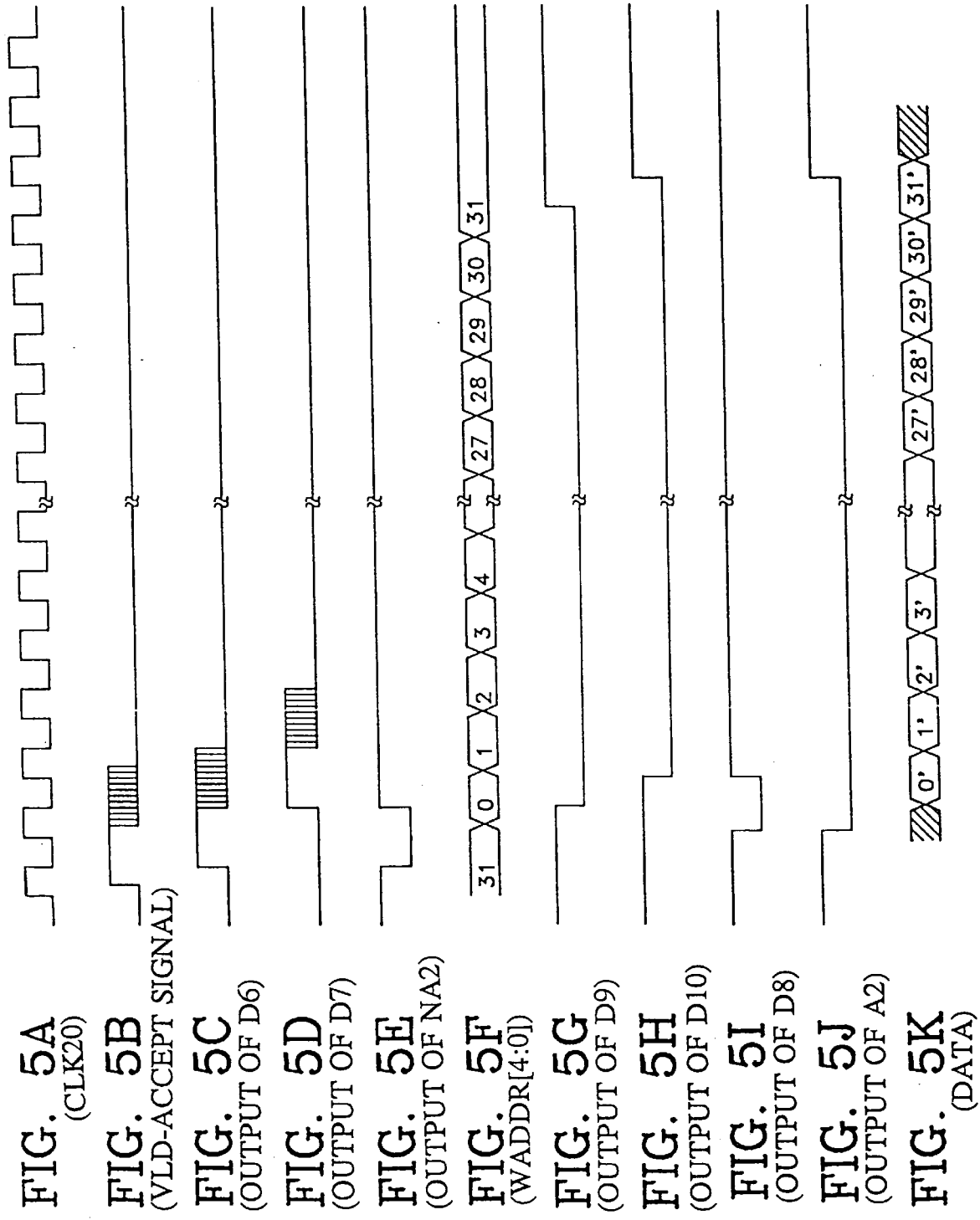

MEMORY INTERFACING METHOD AND CIRCUIT OF VARIABLE LENGTH DECODER FOR ACCESSING EXTERNAL MEMORY WHEN EMPTY PORTION OF INTERNAL MEMORY EXCEEDS A PREDETERMINED LEVEL

BACKGROUND OF THE INVENTION

1. Field of the Invention

The present invention relates to an image compressing/restoring apparatus, and more particularly, to a memory interfacing method for a variable-length decoder and a circuit therefor.

2. Description of Related Art

As the amount of information processed in data storage and retrieval systems and image processors, which are traditionally analog in nature, becomes greater due to conversion to digital modes, the amount of information should be reduced (compressed) in order to efficiently use storage media and transmission channels. The Moving Picture Expert Group (MPEG) has agreed on standards for achieve such reduction. According to a general method for compressing an MPEG-encoded bit stream, i.e., variable-length encoding, repetitive (redundant) information is removed using time and spacial correlations of image information comprising the bit stream.

Here, a variable-length encoder in the image compression apparatus allocates a shorter code to those symbols which occur more frequently, and, in order to restore the encoded image signal, it is applied to an image restoring apparatus comprising a variable-length decoder for restoring the variable-length-compressed signal back into its original form. More particularly, the variable-length decoder controls an external memory to read the shorter codes slowly and the longer codes quickly, by generating a request signal and timely providing the request signal to the external memory. Accordingly, whenever the request signal is received from the variable-length decoder, the external memory sends the data to the variable-length decoder immediately, regardless of code length.

However, stored in the external memory are many kinds of data to be accessed, and when a request signal having a higher priority is received from elsewhere in the system, the request signal from the variable-length decoder must stand by. During this brief waiting period, the image compressing/restoring process is unavoidably interrupted since the variable-length decoder is directly connected to the external memory, with no interface circuitry.

SUMMARY OF THE INVENTION

It is an object of the present invention to provide a memory interfacing method for a variable-length encoder in an image compressing/restoring apparatus, for processing a request signal from a variable-length decoder by employing an internal memory and for requesting high-speed page mode access to an external memory when the amount of data in the internal memory drops below a predetermined level.

To achieve the above object, there is provided in a first embodiment of the invention a memory interfacing method for a variable-length decoder comprising the steps of:

(a) generating a read chip-enable signal and a read address based on a first request signal output from the variable-length decoder, to read data from an internal memory;

(b) generating a second request signal when data stored at an address of the internal memory which is exceeds a predetermined level is read out from the internal memory; and (c) generating and applying a write address and a write section signal to the internal memory when an accept signal is generated in response to the second request signal, to write data provided from an external memory to the internal memory. To further achieve the above object, there is also provided a memory interfacing circuit for a variable-length decoder comprising:

a read controller for generating a read chip-enable signal and a read address based on a first request signal output from the variable length decoder, generating a second request signal when the read address reaches a predetermined level, and providing the second request signal to an external memory controller which is connected to an external memory;

a write controller for generating a write address and a write section signal based on an accept signal when in response to the second request signal the accept signal is generated by the external memory controller; and an internal memory controller, having an internal memory, for controlling data provided from the external memory to be written to the internal memory according to the write address and the write section signal generated by the write controller.

BRIEF DESCRIPTION OF THE DRAWINGS

The above objects and advantages of the present invention will become more apparent by describing in detail a preferred embodiment thereof with reference to the attached drawings in which:

FIGS. 3A–3G are operational timing diagrams illustrating the write operations of the memory interfacing circuit shown in FIG. 2;

FIGS. 4A–4H are operational timing diagrams, illustrating the read operations of the memory interfacing circuit shown in FIG. 2, FIGS. 5A–5K are operational timing diagrams illustrating the write operation in the memory interfacing circuit shown in FIG. 2, after an accept signal is generated.

DETAILED DESCRIPTION OF THE INVENTION

Figure 1:
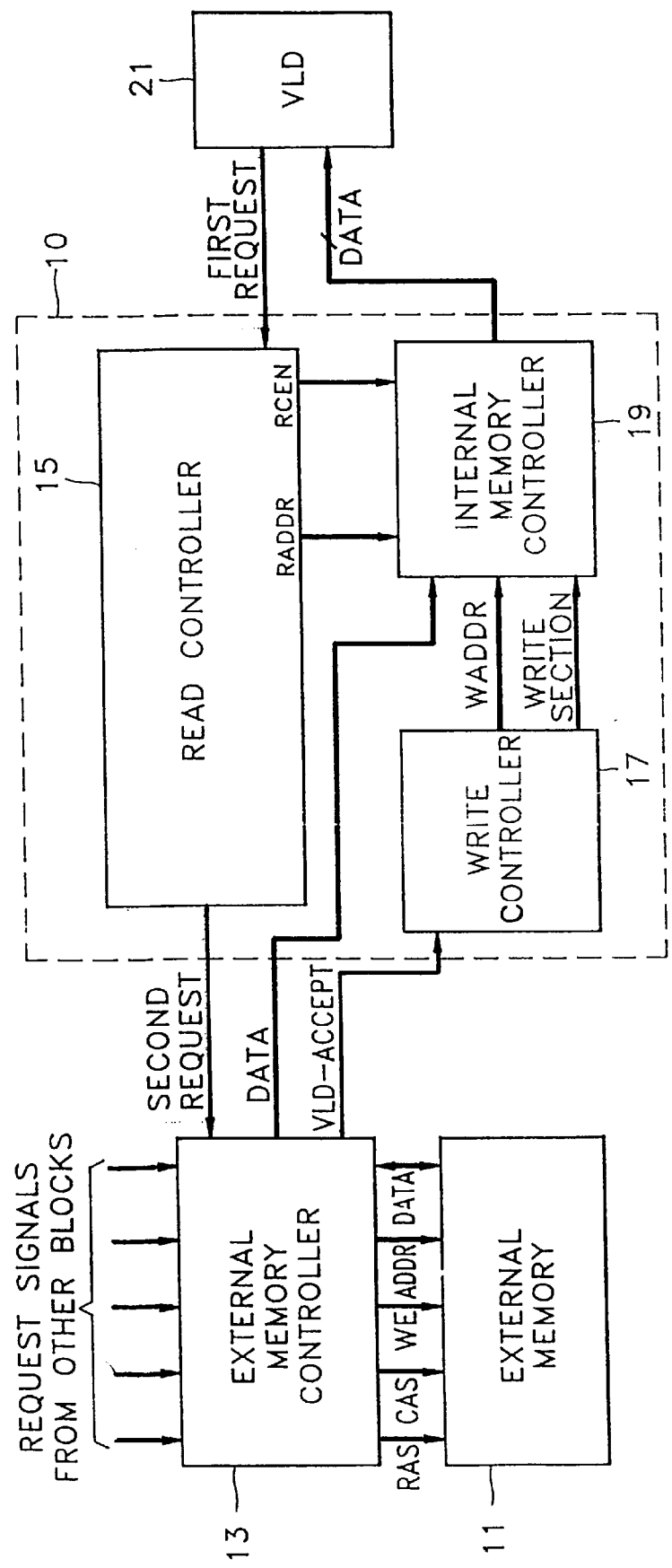
FIG. 1 is a block diagram of a memory interfacing circuit for a variable-length decoder according to the present invention.
Figure 2:
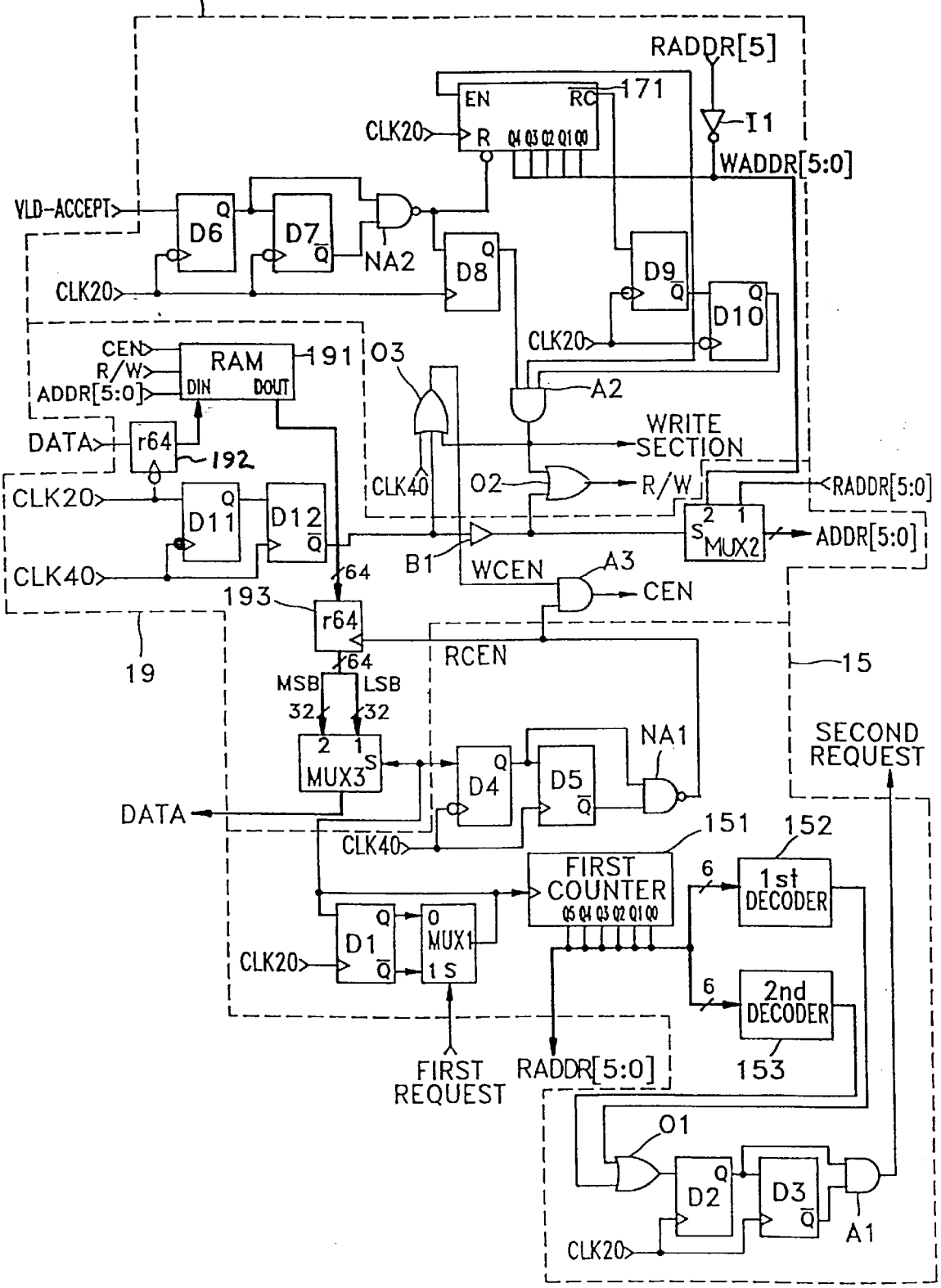
FIG. 2 is a detailed circuit diagram of the memory interfacing circuit shown in FIG. 1.

As shown in FIG. 1, a memory interfacing circuit 10 for a variable-length decoder according to the present invention includes a read controller 15 for generating a read chip-enable signal RCEN and a read address RADDR based on a first request signal output from a variable-length decoder (VLD) 21. Read controller 15 generates a second request signal if the read address reaches a predetermined value, and provides the second request signal to an external memory controller 13. Memory interfacing circuit 10 also includes a write controller 17 for generating a write address WADDR and a write section signal which is based on an accept signal VLD_ACCEPT received from external memory controller 13, which is generated with respect to the second request signal. Also included is an internal memory controller 19, which includes an internal memory, for controlling the data provided from an external memory 11 connected to external memory controller 13 to be written to the internal memory according to the WADDR and the write section signals. (Here, although not expressly shown, the internal memory is preferably a FIFO memory or RAM having a capacity of 64 bits×64 words.) FIG. 2 is a detailed circuit diagram of the memory interfacing circuit 10 shown in FIG. 1. Read controller 15 comprises five D flip-flops D1–D5, a first multiplexer MUX1, a first counter 151, first and second decoders 152 and 153, a first OR gate O1, a first AND gate A1, and a first NAND gate NA1. Write controller 17 comprises five D flip-flops D6–D10, a second NAND gate N2, a second counter 171, an inverter 11, a second AND gate A2, and second and third OR gates O2 and O3. Internal memory controller 19 comprises a RAM 191, two 64bit shift registers 192 and 193, two D flip-flops D11 and D12, second and third multiplexers MUX2 and MUX3, a buffer B1, and AND gate A3.

FIGS. 3A–3G are operational timing diagrams illustrating a write operation of the memory interfacing circuit shown in FIG. 2. FIG. 3A shows a 40 MHz clock signal CLK40; FIG. 3B shows a 20 MHz clock signal CLK20; FIG. 3C shows a write section signal output from AND gate A2; FIG. 3D shows a signal obtained by latching clock signal CLK20 at the falling edges of clock signal CLK40 in flip-flop D11; FIG. 3E shows the $\overline{Q}$ output of D flip-flop D12; FIG. 3F shows a write chip-enable signal WCEN output as a result of the OR operation performed by OR gate O3 with respect to clock signal CLK40, the write section signal (FIG. 3C) and the $\overline{Q}$ output (FIG. 3E) of D flip-flop D12; and FIG. 3G shows a read/write control signal RAN output as a result of the OR operation performed by OR gate O2 with respect to the write section signal (FIG. 3C) and the $\overline{Q}$ output (FIG. 3E) of D flip-flop D12.

FIGS. 4A–4H are operational timing diagrams illustrating a read operation of the memory interfacing circuit shown in FIG. 2. FIGS. 4A and 4B show clock signals CLK40 and CLK20, respectively; FIG. 4C shows the second request signal output from AND gate Al; FIG. 4D shows the output from multiplexer MUX1 which is applied to the select (S) port of multiplexer MUX3; FIG. 4E shows the $\overline{Q}$ output of D flip-flop D4; FIG. 4F shows the $\overline{Q}$ output of D flip-flop D5; FIG. 4G shows a read chip-enable signal RCEN output from NAND gate NA1; and FIG. 4H shows a read address RADDR output from first counter 151.

FIGS. 5A–5K are operational timing diagrams illustrating a write operation of the memory interfacing circuit shown in FIG. 2, after an accept signal is generated. FIG. 5A shows clock signal CLK20; FIG. 5B shows a VLD-accept signal input to D flip-flop D6; FIG. 5C shows a signal obtained by latching the VLD-accept signal at the falling edges of clock signal CLK20, in D flip-flop D6; FIG. 5D shows a signal obtained by latching the Q output (FIG. 5C) of D flip-flop D6, in D flip-flop D7; FIG. 5E shows a signal output from NAND gate NA2; FIG. 5F shows a write address WADDR [4:0] (the most significant bit WADDR[5] being predetermined) output from a second counter 171; FIG. 5G shows a signal obtained by latching the reset-carry ($\overline{RC}$) output of second counter 171 at the falling edges of clock signal CLK20, in D flip-flop D9; FIG. 5H shows a signal obtained by latching the $\overline{Q}$ output (FIG. 5G) from D flip-flop D9 at the rising edges of clock signal CLK20, in D flip-flop D10; FIG. 5I shows a signal obtained by latching the output (FIG. 5E) of NAND gate NA2 at the rising edges of clock signal CLK20, in D flip-flop D8; FIG. 5J shows the write section signal output from AND gate A2; and FIG. 5K shows the data signal to be written to the internal memory at the falling edges of clock signal CLK20.

The operation of the memory interfacing circuit according to the present invention will now be described with reference to FIGS. 1 to 5. In the internal memory controller 19, the clock signal CLK 20 (FIG. 3B) is latched at the falling edge of clock signal CLK 40 (FIG. 3A) by D flip-flop D11 which outputs the signal shown in FIG. 3D, and then latched again at the rising edge of clock signal CLK 40 (FIG. 3A) by D flip-flop D12 which outputs the signal shown in FIG. 3E. The output (FIG. 3E) of D flip-flop D12 is buffered by the buffer B1 which outputs the signal shown in FIG. 3E. In write controller 17, a clock signal CLK 40 (FIG. 3A) the output (FIG. 3E) of D flip-flop D12 and the write section signal (FIG. 3C) is subjected to an OR operation by OR gate O3 which outputs the write chip enable signal WCEN shown in FIG. 3F. Also, the write section signal (FIG. 3C) and the output (FIG. 3E) of buffer B1 are subjected to an OR operation by OR gate O2 which outputs the read or write signal R/W (FIG. 3G).

In read controller 15, when the first request signal generated from VLD 21 is active, e.g., high, it is latched according to a CLK20 signal (a 20 MHz clock signal obtained by dividing the CLK40 clock frequency by two) and then the frequency of the latched signal is divided by two. Here, internal memory controller 19 reads out the data from RAM 191; that is, multiplexer MUX1 toggles the output of D flip-flop D1. On the other hand, multiplexer MUX1 outputs the signal shown in FIG. 4D by holding the previously input value, when the first request signal is low. Thus, for every two occurrences of the first request signal, the output value of first counter 151, i.e., read address RADDR (FIG. 4H), is increased by one, to read out the data of the internal memory. Here, read/write control signal R/W is generated together with the read address RADDR.

That is, after toggling the first request signal from VLD 21 N times, the request signal is used as a read clock for the internal memory, where N is a function of the number of data bits in a unit of storage of the internal memory and a number of bits in a VLD processing unit. For example, if the ratio of the number of data bits of the internal memory to the number of bits in a VLD processing unit is 64:32,then N is equal to one.

Meanwhile, first and second decoders 152 and 153 decode the values "32" and a "0", respectively, among the count values output from first counter 151. The outputs of first and second decoders 152 and 153 are logically combined by OR gate O1. The second request signal (FIG. 4C) is generated from the output of OR gate O1 via D flip-flop D2, D flip-flop D3 and AND gate A1, in accordance with clock signal CLK20, and then provided to external memory controller 13. That is, when read address RADDR equals the predetermined values of "32" or "0," so that the data corresponding to these predetermined addresses is read out from RAM 191, the second request signal is provided to external memory controller 13.

The output (FIG. 4D) of multiplexer MUX1 is latched at the falling edges of clock signal CLK40 by D flip-flop D4 which outputs the signal shown in FIG. 4E, and then latched again at the rising edges of clock signal CLK40 by D flip-flop D5 to output the signal shown in FIG. 4F. The Q output of D flip-flop D4 and the $\overline{Q}$ output of D flip-flop D5 are logically combined according to a NAND operation by NAND gate NA1, to generate read chip-enable signal RCEN (FIG. 4G) having a rate corresponding to the CLK40 signal.

External memory controller 13 receives the second request signal and generates a VLD-accept signal in accordance with a valid time based on the state of other request signals supplied to external memory controller 13 from elsewhere. The VLD-accept signal is then applied to write controller 17.

In write controller 17, when the VLD-accept signal (FIG. 5B) is generated with respect to the second request signal generated by read controller 15, the VLD-accept signal is latched by D flip-flop D6 in order to output the signal shown in FIG. 5C, which is latched again by flip-flop D7 in order to output the signal shown in FIG. 5D, each at the falling edges of clock signal CLK20 (FIG. 5A). The Q output of D flip-flop D6 and the $\overline{Q}$ output of D flip-flop D7 are logically combined by NAND gate NA2 and the result is provided as the reset (R) signal to second counter 171.

After being reset by the output (FIG. 5E) of NAND gate NA2, second counter 171 outputs a count value as shown in FIG. 5F, and then the count value is combined with an inverted read address RADDR[5] to generate a write address WADDR[5:0].

Meanwhile, the reset-carry output signal of second counter 171 is latched at the falling edges of clock signal CLK20 (FIG. 5A) by D flip-flop D9, to output the signal shown in FIG. 5G. The $\overline{Q}$ output (FIG. 5G) of flip-flop D9 is then latched at the rising edges of clock signal CLK20 by D flip-flop D10, to output the signal shown in FIG. 5H. The $\overline{Q}$ output from flip-flop D9 is also applied to the enable port (EN) of second counter 171. Here, flip-fop D9 is provided for removing a glitch.

The output signal (FIG. 5E) of NAND gate NA2 is latched at the rising edges of clock signal CLK20 by D flip-flop D8, to output the signal shown in FIG. 5I. AND gate A2 performs an AND-operation with respect to the Q output (FIG. 5I) of flip-flop D8, the $\overline{Q}$ output (FIG. 5G) of flip-flop D9, and the output (FIG. 5H) of D flip-flop D10, to output the write section signal shown in FIG. 5J.

OR gate O2 performs an OR operation with respect to the write section signal (FIG. 5J) and the $\overline{Q}$ output of flip-flop D12 in the internal memory of the internal,memory controller 19 and outputs read/write control signal R/W. Here, read/write control signal R/W is maintained in a high state with respect to the remaining section other than a writing slot of the writing section.

OR gate O3 performs an OR operation with respect to the write section signal (FIG. 5J), the $\overline{Q}$ output of flip-flop D12 and clock signal CLK40, to generate write chip-enable signal WCEN having a rate corresponding to CLK40.

In internal memory controller 19, first 64-bit shift register 192 shifts the incoming serial data, output from external memory controller 13, to generate 64-bit parallel data having a rate corresponding to CLK20, and then provides the parallel data to RAM 191. RAM 191 outputs 64-bit parallel data, which is divided by 64-bit shift register 193 into upper and lower 32-bit signals according to read chip-enable signal RCEN and the result is provided to multiplexer MUX3. Multiplexer MUX3 selects the upper 32 bits or the lower 32 bits according to the signal output from multiplexer MUX1 of read controller 15 and provides the selected data signal to VLD 21. AND gate A3 generates a chip-enable signal CEN from read chip-enable signal RCEN and write chip-enable signal WCEN.

According to the present invention, for the sake of convenience, it is assumed that 64-bit data is stored in locations of external memory 11 and VLD 21 performs VLD-processing with respect to the data by dividing it into 32-bit units. Thus, when writing data from external memory 11 into RAM 191 of internal memory controller 19, 64-bit data is written. However, when the read address with respect to the second request signal is generated, 64-bit data should be divided into a 32-bit unit, to be provided to VLD 21. Thus, RAM 191 having 64-bits×64words in the preferred embodiment of the present invention may be changed based on the particular application. Also, though shown here as being "64," the address of the 64-bit data stored in RAM 191 of internal memory controller 19 can be modified according to the application, since this value is related to the variable-length decoder's processing speed and the maximum delay time until an accept signal for the second VLD request signal is generated. Further, when the read addresses are "0" and "32" among the 64-bit data, the second request signal is generated; however, the particular read addresses may be easily changed.

The clock signals CLK20 and CLK40 may have other frequencies besides the preferred frequencies of 20 MHz and 40 MHz, so long as they have same ratio as described above, obtained by dividing the frequency of one of the clock signals by two.

The memory interfacing circuit according to the present invention can be applied as a buffer controller for controlling a buffer according to the data input speed, or as a memory interface for an apparatus conforming to the widely used Bell Core VLD architecture. Also, the interfacing operation can be easily performed regardless of the state of the external memory, by controlling the buffer using a request/accept mode to the external memory.

A memory interfacing circuit of the present invention is applied to MPEG compression standards in which the VLD processing unit is comprised of 32-bits and used with a 64-bit external memory, and which can be applied to HDTV systems.

As described above, according to the memory interfacing method of the variable-length decoder in an image compressing/restoring apparatus and circuit therefor, the data of the internal memory is read out with respect to the request signal generated by the variable-length decoder, and a high-speed data request signal is provided to the external memory when the empty portion of internal memory exceeds a predetermined level. After the accept signal is generated, the input data is written to the internal memory, so that complex signal processing due to the frequent memory access between a variable-length decoder and external memory, can be simplified.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

I claim:

1. A memory interfacing circuit of a variable-length decoder comprising:

a read controller which generates a read chip-enable signal and a read address based on a first request signal output from the variable-length decoder, a second request signal to access an external memory when said read address reaches a predetermined level, and outputs said second request signal to an external memory controller which is connected to said external memory, wherein said read controller comprises:

a first multiplexer for generating a read clock with a first clock from said first request signal;

a first counter for generating said read address by counting said read clock;

first and second decoders for determining whether said read address is at a first predetermined level or a second predetermined level;

a first signal generator for generating said second request signal from a decoding result of said first and second decoders; and a second signal generator for generating said read chip enable signal with a second clock from said read clock;

a write controller which receives an accept signal generated by said external memory controller and generates a write address and a write section signal based on said accept signal, wherein said accept signal is generated by said external memory controller in response to said second request signal; and an internal memory controller having an internal memory, which controls data provided from said external memory to be written to said internal memory according to said write address and said write section signal generated by said write controller.

2. A memory interfacing circuit as claimed in claim 1, wherein said read chip-enable signal output from said read controller is generated by toggling said first request signal N times.

3. A memory interfacing circuit as claimed in claim 2, wherein N is determined according to the number of data bits constituting a unit of storage in said internal memory and the number of bits in a processing unit of the variable-length decoder.

4. A memory interfacing circuit as claimed in claim 2, wherein said write controller comprises:

a third signal generator which receives said accept signal and generates a reset signal in response thereto;

a second counter which receives said first clock and said reset signal, generates said write address by counting according to said first clock, generates a reset-carry signal, and resets the count in response to said reset signal;

a fourth signal generator which generates said write section signal in response to said reset signal and said reset-carry signal generated by said second counter;

a fifth signal generator which generates a read/write control signal in response to said write section signal and a signal obtained by latching said first clock according to a second clock; and a sixth signal generator which generates a write chip-enable signal in response to said second clock, said write section signal and said signal obtained by latching said first clock according to said second clock.

5. A memory interfacing circuit as claimed in claim 4 wherein said internal memory controller comprises:

a second multiplexer which selectively outputs as an address signal said read address and said write address in response to said signal obtained by latching said first clock according to said second clock;

a seventh signal generator which generates a chip-enable signal from said read chip-enable signal and said write chip-enable signal;

a first shift register which receives and shifts data provided from said external memory controller;

a second shift register which outputs data output from said internal memory according to said read clock; and a third multiplexer which receives and divides said data output from said second shift register into upper and lower bits according to said read clock and outputs the divided data, wherein said internal memory stores the data shifted by said first shift register in response to said chip-enable signal, address signal and read/write control signal.

6. A memory interfacing circuit as claimed in claim 5, wherein said first clock is obtained by diving the frequency of said second clock by a factor of two.

7. A memory interfacing circuit as claimed in claim 4, wherein said first clock is obtained by dividing the frequency of said second clock by a factor of two.

8. A memory interfacing circuit as claimed in claim 1, wherein said first clock is obtained by dividing the frequency of said second clock by a factor of two.

9. memory interfacing circuit as claimed in claim 1, wherein said decoder unit comprises first and second decoders each connected to said first counter and determine said first and second predetermined levels, respectively.

10. A memory interfacing circuit as claimed in claim 9, wherein said first predetermined level is "32" and said second predetermined level is "0".

11. A memory interfacing circuit of a variable-length decoder comprising:

a read controlling means for generating a read chip-enable signal and a read address based on a first request signal output from the variable length decoder, generating a second request signal when said read address reaches a predetermined level, and providing said second request signal to an external memory controller which is connect to said external memory, wherein said read controlling means comprises:

first multiplexing means for generating a read clock based on a first clock and said first request signal;

first counting means for generating said read address by counting according to said read clock;

first and second decoding means for determining whether said read address is at first predetermined level or a second predetermined level;

first signal generating means for generating said second request signal based on a decoding result of said first and second decoding means; and second signal generating means for generating said read chip enable signal based on said read clock and a second clock;

write controlling means for generating a write address and a write section signal based on said accept signal, wherein said accept signal is generated by said external memory controlling in response to said second request signal; and internal memory controlling means having an internal memory, for controlling data provided from said external memory to be written to said internal memory according to said write address and said write section signal generated by said controller.

12. A memory interfacing circuit as claimed in claim 11, wherein said read chip-enable signal output from said read controller means is generated by toggling said first request signal N times.

13. A memory interfacing circuit as claimed in claim 12, wherein N is determined according to the number of data bits constituting a unit of storage in said internal memory and the number of bits in a processing unit of the variable-length decoder.

14. A memory interfacing circuit as claimed in claim 11, wherein said write controlling comprises:

third signal generating means for generating a reset signal based on said accept signal;

second counting means, which receives said first clock and said reset signal, for generating said write address by counting according to said first clock, generating a reset-carry signal, and resetting the count of said second counting means in response to said reset signal;

fourth signal generating means for generating said write section signal in response to said reset signal and said reset-carry signal;

fifth signal generating means for generating a read/write control signal in response to said write section signal and a signal obtained by latching said first clock according to said second clock; and sixth signal generating means for generating a write chip-enable signal in response to said second clock, said write section signal and said signal obtained by latching said first clock according to said second clock.

15. A memory interfacing circuit as claimed in claim 14, wherein said internal memory controlling means comprises:

second multiplexing means for selectively outputting as an address signal said read address and said write address in response to said signal obtained by latching said first clock according to said second clock;

seventh signal generating means for generating a chip-enable signal from said read chip-enable signal and said write chip-enable signal;

first shifting means for shifting data provided from said external memory controller;

second shifting means for outputting data output from said internal memory according to said read clock; and third multiplexing means for dividing said data output from said second shifting means into upper and lower bits according to said read clock and outputting the divided data, wherein said internal memory stores the data shifted by said first shifting means in response to said chip-enable signal, address signal and read/write control signal.

16. A memory interfacing circuit as claimed in claim 15, wherein said first clock is obtained by dividing the frequency of said second clock by a factor of two.

* * * * *